United States Patent
Eisner (10) Patent No.: US 9,620,327 B2
(45) Date of Patent: Apr. 11, 2017

(54) COMBINED MULTIPOLE MAGNET AND DIPOLE SCANNING MAGNET

(71) Applicant: Axcelis Technologies, Inc., Beverly, MA (US)

(72) Inventor: Edward C. Eisner, Lexington, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 14/978,776

(22) Filed: Dec. 22, 2015

(65) Prior Publication Data

US 2016/0189913 A1    Jun. 30, 2016

Related U.S. Application Data

(60) Provisional application No. 62/096,968, filed on Dec. 26, 2014.

(51) Int. Cl.
| | |
|---|---|
| H01J 37/00 | (2006.01) |
| H01J 37/141 | (2006.01) |
| H01J 37/08 | (2006.01) |
| H01J 37/317 | (2006.01) |
| H01J 37/147 | (2006.01) |

(52) U.S. Cl.
CPC ............ H01J 37/141 (2013.01); H01J 37/08 (2013.01); H01J 37/1475 (2013.01); H01J 37/3171 (2013.01); H01J 2237/04922 (2013.01); H01J 2237/1415 (2013.01); H01J 2237/152 (2013.01)

(58) Field of Classification Search
CPC ...... H01J 37/141; H01J 37/08; H01J 37/3171; H01J 37/1475; H01J 2237/1415; H01J 2237/152; H01J 2237/04922
USPC ............................ 250/396 ML, 492.1–492.3
See application file for complete search history.

(56) References Cited

U.S. PATENT DOCUMENTS

| | | | | |
|---|---|---|---|---|
| 3,984,687 A | * | 10/1976 | Loeffler | H01J 37/09 250/396 ML |
| 4,469,948 A | * | 9/1984 | Veneklasen | H01J 37/3007 250/396 ML |
| 5,672,879 A | * | 9/1997 | Glavish | H01J 37/1475 250/396 ML |
| 7,019,314 B1 | * | 3/2006 | Benveniste | H01J 37/3171 250/290 |
| 8,637,838 B2 | | 1/2014 | Eisner et al. | |

(Continued)

OTHER PUBLICATIONS

Biallas, et al ("Combined Panofsky Quadrupole & Corrector Dipole" Proceedings of PAC07, Albuquerque, New Mexico, USA, 2007, pp. 602-604).*

*Primary Examiner* — Michael Maskell
(74) *Attorney, Agent, or Firm* — Eschweiler & Potashnik, LLC (57) ABSTRACT

A combined scanning and focusing magnet for an ion implantation system is provided. The combined scanning and focusing magnet has a yoke having a high magnetic permeability. The yoke defines a hole configured to pass an ion beam therethrough. One or more scanner coils operably are coupled to the yoke and configured to generate a time-varying predominantly dipole magnetic field when electrically coupled to a power supply. One or more focusing coils are operably coupled to the yoke and configured to generate a predominantly multipole magnetic field, wherein the predominantly multipole magnetic field is one of static or time-varying.

18 Claims, 5 Drawing Sheets

(56) References Cited

U.S. PATENT DOCUMENTS

| | | | | |
|---|---|---|---|---|
| 2006/0017010 A1* | 1/2006 | Vanderberg | ............ | G21K 1/093 |
| | | | | 250/492.1 |
| 2010/0001204 A1* | 1/2010 | White | ................... | H01J 37/147 |
| | | | | 250/398 |
| 2011/0266456 A1* | 11/2011 | Vanderberg | ......... | H01J 37/1475 |
| | | | | 250/396 R |
| 2013/0146760 A1* | 6/2013 | Eisner | ................... | H01J 37/244 |
| | | | | 250/288 |

* cited by examiner

COMBINED MULTIPOLE MAGNET AND DIPOLE SCANNING MAGNET

REFERENCE TO RELATED APPLICATION

This application claims priority to and the benefit of U.S. Provisional Application Ser. No. 62/096,968 which was filed Dec. 26, 2014, entitled "COMBINED MULTIPOLE MAGNET AND DIPOLE SCANNING MAGNET", the entirety of which is hereby incorporated by reference as if fully set forth herein.

FIELD OF THE INVENTION

The present invention relates generally to ion implantation systems and methods, and more specifically to a combined multi-polar focusing magnet and beam-scanning magnet for controlling an ion beam.

BACKGROUND OF THE INVENTION

Conventionally, ion implanters are utilized to place a specified quantity of dopants or impurities within workpieces or semiconductor wafers. In a typical ion implantation system, a dopant material is ionized and accelerated, therein generating a beam of ions. The ion beam is directed at a surface of the semiconductor wafer to implant ions into the wafer, wherein the ions penetrate the surface of the wafer and form regions of desired conductivity therein. For example, ion implantation has particular use in the fabrication of transistors in semiconductor workpieces. A typical ion implanter comprises an ion source for generating the ion beam, a beamline assembly having a mass analysis apparatus for directing and/or filtering (e.g., mass resolving) ions within the beam, and a target chamber containing one or more wafers or workpieces to be treated.

Various types of ion implanters allow respectively varied dosages and energies of ions to be implanted, based on the desired characteristics to be achieved within the workpiece. For example, high-current ion implanters are typically used for high dose implants, and medium-current to low-current ion implanters are utilized for lower dose applications. An energy of the ions can further vary, wherein the energy generally determines the depth to which the ions are implanted within the workpiece, such as to control junction depths in semiconductor devices. Typically, low- to medium-current implanters have a substantial length of travel of the ion beam (also called the beamline of the implanter) before it impacts the workpiece. High-current implanters, however, typically have a much shorter beamline due, at least in part, to the low energies associated with the ion beam, wherein the high-current ion beams tend to lose coherence with longer beamlines.

The ion beam can be stationary, wherein the workpiece is scanned through the stationary beam during implantation. Such a scanning of the workpiece often requires a complex architecture for uniformly translating the workpiece through the stationary ion beam. One alternative to only translating the workpiece is to scan or dither the ion beam in one direction while translating the workpiece in an approximately orthogonal direction. An electromagnet is typically used to alter the path of the ion beam in a controlled manner. However, such a scanner magnet often inhabits a significant portion of real estate along the beamline. Furthermore, in the case of a scanned ion beam, there is often a greater need to focus the ion beam to provide optimal scanning of the beam. However, since the scanner magnet consumes a great deal of beamline length, the implementation of such focusing magnets or optics is conventionally limited.

SUMMARY OF THE INVENTION

The present disclosure overcomes the limitations of the prior art by providing a system, apparatus, and method that provides concurrent control of ion beam scanning and focusing with a combined scanning and focusing magnet. Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the disclosure in a simplified form as a prelude to the more detailed description that is presented later.

In both scanned beam and dithered pencil beam ion implanters, it is desirable to have as much control of various features as possible in order to adjust a shape of the ion beam, incident angles, and other desired characteristics of the ion beam. A scanner magnet is often a significant portion of a beam line of an ion implanter, but typically provides no overall static focusing. By combining a scanner with a multipole magnet (e.g., quadrupole or sextupole magnet), or a series of multipole magnets (e.g., in the case of a long scanner), a large savings in beamline length can be attained.

Scanner magnets can provide focusing depending on the angle of the scan. That is, the scanner magnets generally provide no focusing when the ion beam passes straight through, but provide stronger focusing when the ion beam is at or near a maximum bend angle. Thus, it can be advantageous to either enhance or reduce such angle-dependent focusing, whereby a multipole magnet is provided with a time-dependent waveform similar to that which drives the scanner magnet, in addition to any static DC component.

The scanner magnet is placed so that a waist of the ion beam (e.g., the narrowest portion in the x-direction) occurs at or near a vertex of the scan. The waist of the beam is also a preferred place for the multipole magnet of the present disclosure, as it is possible to add focusing in the perpendicular direction to the waist (e.g., in the y-direction) without greatly affecting the beam in the waist direction. In addition, should a corrector be used after the scanner, the corrector will parallelize out any defocusing in the waist direction. The present disclosure thus advantageously provides a combined multipole magnet with a dipole scanning magnet.

The combined magnet, for example, is made of steel laminations to reduce eddy-current loss in the steel yoke. The scanner coils can be of any shape and be designed based on various design criteria. For example, simple coils illustrated in the figures can be wrapped around the yoke, or bedstead coils or other coils can be implemented. The coils, for example, are in vacuum or in air. The multipole coils, for example, can also be similar coils, with the addition of flux compensation. One of the figures shows a Panofsky-type quadrupole nested inside dipole coils.

In accordance with the disclosure, an ion implantation system is provided, wherein the ion implantation system comprises an ion source configured to generate a beam of ions. The ion source, for example, may be configured to generate a spot ion beam or a ribbon beam. The ion implantation system further comprises a mass analyzer or mass resolving magnet configured to mass resolve the beam of ions. A mass resolving aperture is further positioned downstream of the mass analyzer, wherein the mass resolving aperture is configured to filter undesirable species from the ion beam.

According to one exemplary aspect of the disclosure, a combined scanning and focusing magnet is positioned downstream of the mass resolving magnet. The combined scanning and focusing magnet is configured to control a path of the ion beam downstream of the mass resolving magnet for a scanning or dithering of the ion beam, while concurrently focusing the ion beam via a multi-pole magnet.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present disclosure is directed generally toward an ion implantation system and method for implanting ions in a workpiece, wherein a beam of ions is generally concurrently magnetically scanned and focused via a combined multipole and dipole scanning and focusing magnet. Accordingly, the present disclosure will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present disclosure. It will be evident to one skilled in the art, however, that the present disclosure may be practiced without these specific details.

Figure 1:
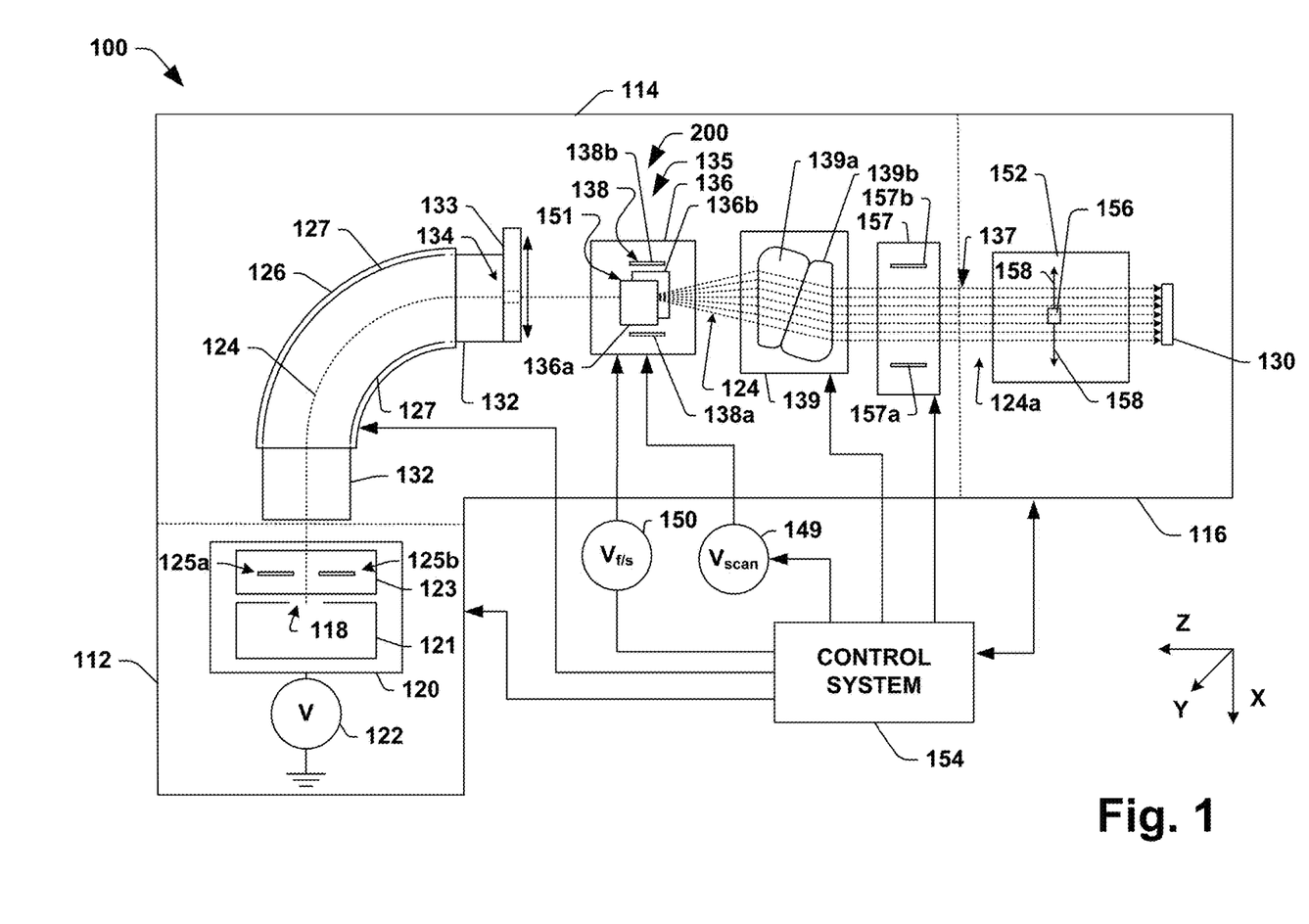
FIG. 1 is a block diagram illustrating an exemplary ion implantation system according several aspects of the present disclosure.

Referring now to the Figures, FIG. 1 illustrates ion implantation system 100 in accordance with various exemplary aspects of the present disclosure. The system 100 is presented for illustrative purposes and it is appreciated that aspects of the disclosure are not limited to the described ion implantation system and that other suitable ion implantation systems of varied configurations can also be employed.

The system 100 has a terminal 112, a beamline assembly 114, and an end station 116. The terminal 112 includes an ion source 120 powered by a high voltage power supply 122 that produces and directs an ion beam 124 to the beamline assembly 114. The ion source 120 generates charged ions that are extracted and formed into the ion beam 124, which is directed along a beam path in the beamline assembly 114 to the end station 116.

To generate the ions, a gas of a dopant material (not shown) to be ionized is located within a generation chamber 121 of the ion source 120. The dopant gas can, for example, be fed into the chamber 121 from a gas source (not shown). In addition to power supply 122, it will be appreciated that any number of suitable mechanisms (none of which are shown) can be used to excite free electrons within the ion generation chamber 121, such as RF or microwave excitation sources, electron beam injection sources, electromagnetic sources and/or a cathode which creates an arc discharge within the chamber, for example. The excited electrons collide with the dopant gas molecules and ions are generated thereby. Typically, positive ions are generated although the disclosure herein is applicable to systems wherein negative ions are generated as well.

The ions are controllably extracted through a slit 118 in the chamber 121 by an ion extraction assembly 123, in this example. The ion extraction assembly 123 comprises a plurality of extraction and/or suppression electrodes 125. The extraction assembly 123 can include, for example, a separate extraction power supply (not shown) to bias the extraction and/or suppression electrodes 125 to accelerate the ions from the generation chamber 121. It can be appreciated that since the ion beam 124 comprises like charged particles, the beam may have a tendency to blow up or expand radially outwardly as the like charged particles repel one another. It can also be appreciated that beam blow up can be exacerbated in low energy, high current (high perveance) beams where many like charged particles (e.g., high current) are moving in the same direction relatively slowly (e.g., low energy) such that there is an abundance of repulsive forces among the particles.

Accordingly, the extraction assembly 123 is generally configured so that the beam is extracted at a high energy so that the beam does not blow up. Moreover, the beam 124, in this example, is generally transferred at a relatively high energy throughout the system and is reduced just before the workpiece 130 to promote beam containment.

The beamline assembly 114 has a beamguide 132, a mass analyzer 126, a combined scanning and focusing system 135, and a parallelizer 139. The mass analyzer 126 performs mass analysis and angle correction/adjustment on the ion beam 124. The mass analyzer 126, in this example, is formed at about a ninety degree angle and comprises one or more magnets (not shown) that serve to establish a (dipole) magnetic field therein. As the beam 124 enters the mass analyzer 126, it is correspondingly bent by the magnetic field such that ions of an inappropriate charge-to-mass ratio are rejected. More particularly, ions having too great or too small a charge-to-mass ratio are deflected into side walls 127 of the mass analyzer 126. In this manner, the mass analyzer 126 merely allows those ions in the beam 124 which have the desired charge-to-mass ratio to pass there-through and exit through a resolving aperture 134 of an aperture assembly 133.

The mass analyzer 126 can perform angle corrections on the ion beam 124 by controlling or adjusting an amplitude of the magnetic dipole field. This adjustment of the magnetic field causes selected ions having the desired/selected charge-to-mass ratio to travel along a different or altered path. As a result, the resolving aperture 134 can be adjusted according to the altered path. In one example, the aperture assembly 133 is movable about an x direction so as to accommodate altered paths through the aperture 134. In another example, the aperture 134 is shaped so as to accommodate a selected range of altered paths. The mass analyzer 126 and the resolving aperture 134 allow variations in the magnetic field and resulting altered path while maintaining suitable mass resolution for the system 100. More detailed examples of suitable mass analyzer and resolving aperture systems are provided below.

It will be appreciated that ion beam collisions with other particles in the system 100 can degrade beam integrity. Accordingly, one or more pumps (not shown) may be included to evacuate, at least, the beamguide 132 and mass analyzer 126.

The present disclosure appreciates that it is sometimes difficult to focus the beam after scanning, whereby it is can be desirable to have the focusing elements as close to the scanner as possible. The combined scanning and focusing system 135 in accordance with the present disclosure includes a magnetic scanning element 136 and a focusing and/or steering element 138 that are advantageously combined as a single unit, thus locating the focusing element as far downstream as possible without resorting to extremely complicated assemblies to focus a scanned beam. Respective power supplies 149, 150 are operatively coupled to the scanning element 136 and the focusing and steering element 138, and more particularly to scanning coils 136a, 136b and focusing coils 138a, 138b located therein.

The focusing and steering element 138 receives the mass analyzed ion beam 124 having a relatively narrow profile (e.g., a "pencil" or "spot" beam in the illustrated system 100). It should be noted that while the ion beam 124 is primarily described in the present disclosure as having a relatively narrow profile, the ion beam may alternatively have an elongate profile (e.g., a generally ovular cross-section when viewed from along the nominal beam path, and generally referred to as a "ribbon" ion beam), and all such ion beams are contemplated as falling within the scope of the present disclosure.

In accordance with one example, a voltage, such as an alternating current (AC) or direct current (DC) voltage applied by the power supply 150 to the focusing coils 138a and 138b operates to focus and steer the ion beam 124 to the scan vertex 151 of the scanning element 136. A voltage waveform applied by the power supply 149 (which could be the same supply as the power supply 150) to the scanning coils 136a and 136b then scans the beam 124 back and forth, in this example. It will be appreciated that the scan vertex 151 can be defined as the point in the optical path from which each beamlet or scanned part of the beam appears to originate after having been scanned by the scanning element 136.

The scanned beam 124 is then passed through the parallelizer/corrector 139, which comprises two dipole magnets 139a, 139b in the illustrated example. The dipoles are substantially trapezoidal and are oriented to mirror one another to cause the beam 124 to bend into a substantially S-shape. Stated another way, the dipoles parallelizer/corrector 139 of the present example have equal angles and radii and opposite directions of curvature. The parallelizer/corrector 139 causes the scanned beam 124 to alter its path such that the beam travels parallel to a beam axis regardless of the scan angle. As a result, the implantation angle is relatively uniform across the workpiece 130.

One or more deceleration stages 157 are located downstream of the parallelization component 139 in this example. Up to this point in the system 100, the ion beam 124 is generally transported at a relatively high energy level to mitigate the propensity for beam blow up, which can be particularly high where beam density is elevated such as at scan vertex 151, for example. The deceleration stage 157 comprises one or more electrodes 157a, 157b operable to decelerate the ion beam 124. The electrodes 157 are typically apertures thru which the beam travels, may be drawn as straight lines in FIG. 1.

Nevertheless, it will be appreciated that while two electrodes or coils 125a and 125b, 136a and 136b, 138a and 138b and 157a and 157b are respectively illustrated in the exemplary ion extraction assembly 123, scanning element 136, focusing and steering element 138 and deceleration stage 157, that these elements 123, 136, 138 and 157 may comprise any suitable number of electrodes or coils arranged and biased to accelerate and/or decelerate ions, as well as to focus, bend, deflect, converge, diverge, scan, parallelize and/or decontaminate the ion beam 124 such as provided in U.S. Pat. No. 6,777,696 to Rathmell et al. the entirety of which is hereby incorporated herein by reference.

The end station 116 then receives the ion beam 124 which is directed toward a workpiece 130. It is appreciated that different types of end stations 116 may be employed in the implanter 100. For example, a "batch" type end station can simultaneously support multiple workpieces 130 on a rotating support structure, wherein the workpieces 130 are rotated through the path of the ion beam until all the workpieces 130 are completely implanted. A "serial" type end station, on the other hand, supports a single workpiece 130 along the beam path for implantation, wherein multiple workpieces 130 are implanted one at a time in serial fashion, with each workpiece 130 being completely implanted before implantation of the next workpiece 130 begins. In hybrid systems the workpiece 130 may be mechanically translated in a first (Y or slow scan) direction while the beam is scanned in a second (X or fast scan) direction to impart the beam 124 over the entire workpiece 130.

The end station 116 in the illustrated example is a "serial" type end station that supports the single workpiece 130 along the beam path for implantation. A dosimetry system 152 is included in the end station 116 near the workpiece location for calibration measurements prior to implantation operations. During calibration, the beam 124 passes through dosimetry system 152. The dosimetry system 152 includes one or more profilers 156 that may continuously traverse a profiler path 158, thereby measuring the profile of the scanned beams.

The profiler 156, in this example, may comprise a current density sensor, such as a Faraday cup, for example, that measures the current density of the scanned beam, where current density is a function of the angle of implantation (e.g., the relative orientation between the beam and the mechanical surface of the workpiece and/or the relative orientation between the beam and the crystalline lattice structure of the workpiece). The current density sensor moves in a generally orthogonal fashion relative to the scanned beam and thus typically traverses the width of the ribbon beam. The dosimetry system, in one example, measures both beam density distribution and angular distribution.

A control system 154 is present that can control, communicate with and/or adjust the ion source 120, the mass analyzer 127, the aperture assembly 133, the combined scanning and focusing system 135 including the scanning element 136 and focusing and/or steering element 138, the parallelizer 139, and the dosimetry system 152. The control system 154 may comprise a computer, microprocessor, etc., and may be operable to take measurement values of beam characteristics and adjust parameters accordingly. The control system 154 can be coupled to the terminal 112 from which the beam of ions is generated, as well as the mass analyzer 126 of the beamline assembly 114, the scanning element 136 (e.g., via power supply 149), the focusing and steering element 138 (e.g., via power supply 150), the parallelizer 139 and the deceleration stage 157. Accordingly, any of these elements can be adjusted by the control system 154 to facilitate desired ion implantation. For example, the energy level of the beam can be adapted to adjust junction depths by adjusting the bias applied to electrodes in the ion extraction assembly 123 and the deceleration stage 157, for example.

The strength and orientation of magnetic field(s) generated in the mass analyzer 126 can be adjusted, such as by regulating the amount of electrical current running through field windings therein to alter the charge to mass ratio of the beam, for example. The angle of implantation can be controlled by adjusting the strength or amplitude of the magnetic field(s) generated in the mass analyzer 126 in coordination with the aperture assembly 133. The control system 154 can adjust the magnetic field(s) of the mass analyzer 126 and position of the resolving aperture 134 according to measurement data from, in this example, the profiler 156. The control system 154 can verify the adjustments via additional measurement data and perform additional adjustments via the mass analyzer 126 and the resolving aperture 134 if necessary.

Figure 2:
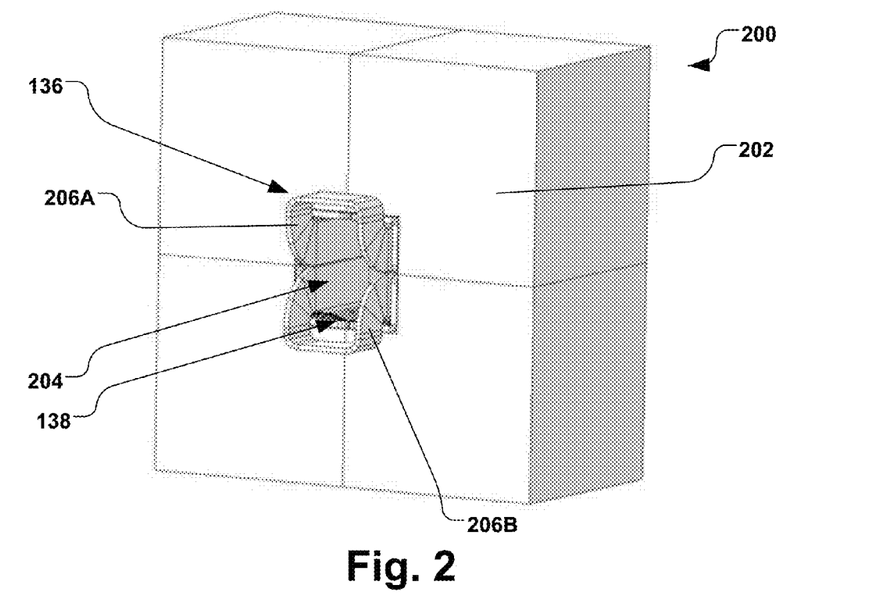
FIG. 2 is a perspective view of an exemplary combined scanning and focusing magnet according an aspect of the present disclosure.

The combined scanning and focusing system 135, in accordance with one or more aspects of the present disclosure, comprises a combined scanning and focusing magnet 200, as illustrated in FIG. 2, wherein the combined scanning and focusing magnet 200 comprises both the scanning element 136 and multi-pole focusing element 138 of FIG. 1, and wherein the combined scanning and focusing magnet is configured to electromagnetically scan the ion beam 124, while concurrently providing additional focusing of the ion beam.

Figure 3A:
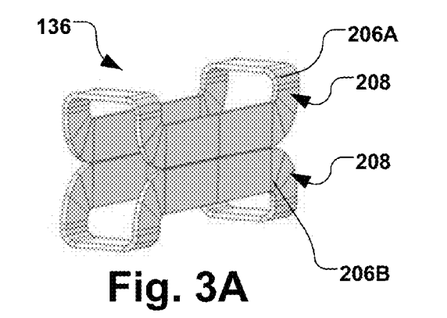
FIG. 3A is a perspective view of an exemplary dipole scanning coil of the combined scanning and focusing magnet of FIG. 2 according to another aspect of the disclosure.

The combined scanning and focusing magnet 200 of FIG. 2, for example, comprises a yoke 202 having a high magnetic permeability (e.g., a ferrous yoke), wherein the yoke generally defines a hole 204 configured to pass the ion beam 124 of FIG. 1 therethrough. The yoke 202, for example, comprises a generally rectangular steel yoke, and may be comprised of a plurality of laminated ferrous sheets. One or more scanner coils 206A, 206B, as further illustrated in FIG. 3A, for example, are operably coupled to the yoke 202 of FIG. 2, wherein the one or more scanner coils are configured to generate a time-varying, predominantly dipole magnetic field when electrically coupled to the power supply 149. As illustrated in FIGS. 2 and 3A, the one or more scanner coils 206A, 206B comprise one or more bedstead coils 208.

Figure 3B:
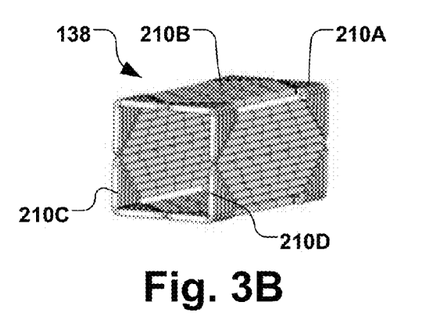
FIG. 3B is a perspective view of an exemplary Panofsky-type quadrupole focusing coil of the combined scanning and focusing magnet of FIG. 2 according to another aspect of the disclosure.

In accordance with another exemplary aspect of the disclosure, one or more focusing coils 210A-210D are operably coupled to the yoke 202 of FIG. 2, wherein the one or more focusing coils are configured to generate a predominantly multipole (e.g., quadrupole or sextupole) magnetic field when electrically coupled to the power supply 150 of FIG. 1. For example, the predominantly multipole magnetic field is one of a static magnetic field or a time-varying magnetic field. For example, the multipole magnetic field may be set once for one ion beam and subsequently changed for a different ion beam. Alternately, an alternating current can be used, either in phase with the scanner current, or out of phase with the scanner current. FIG. 3B illustrates the one or more focusing coils 210A-210D, wherein the one or more focusing coils comprise Panofsky-type multipole coils (e.g., a quadrupole). Alternatively, the one or more focusing coils 210 comprise any number of bedstead coils (not shown).

Figure 3C:
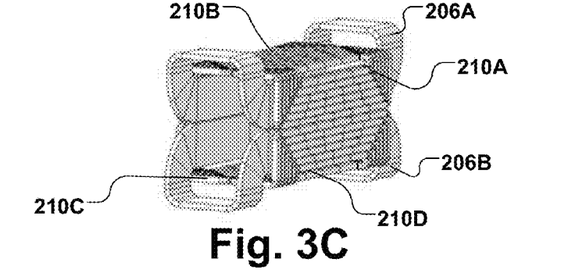
FIG. 3C is a perspective view of both of the scanning coil and focusing coil of the combined scanning and focusing magnet of FIG. 2 according to another aspect of the disclosure.

FIG. 3C illustrates the one or more scanner coils 206A, 206B and one or more focusing coils 210A-210D without the yoke of FIG. 2 for further clarity. In accordance with the present disclosure, scanning of the ion beam 124 of FIG. 1 is accomplished by passing electrical current through the one or more scanner coils 206A, 206B of FIG. 3C, while focusing and steering of the ion beam is accomplished by passing electrical current through the one or more focusing coils 210A-210D.

Figure 4:
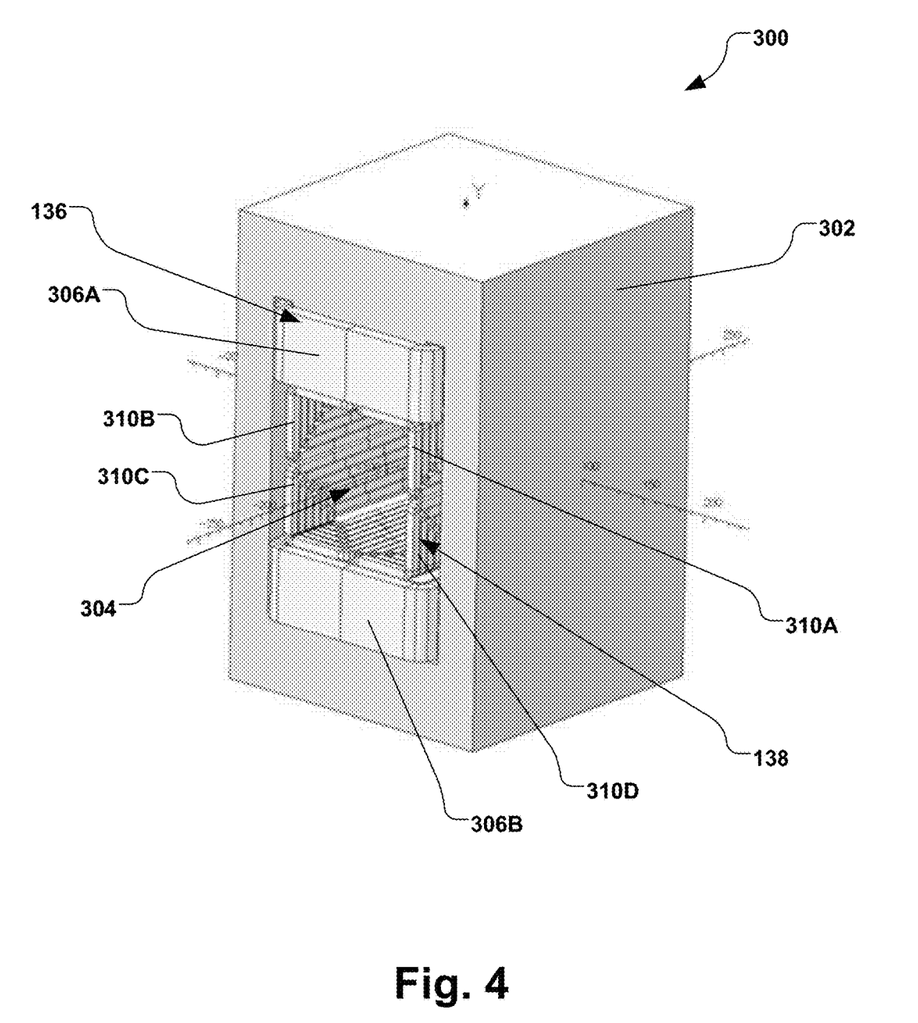
FIG. 4 is a perspective view of another exemplary combined scanning and focusing magnet according yet another aspect of the present disclosure.
Figure 5A:
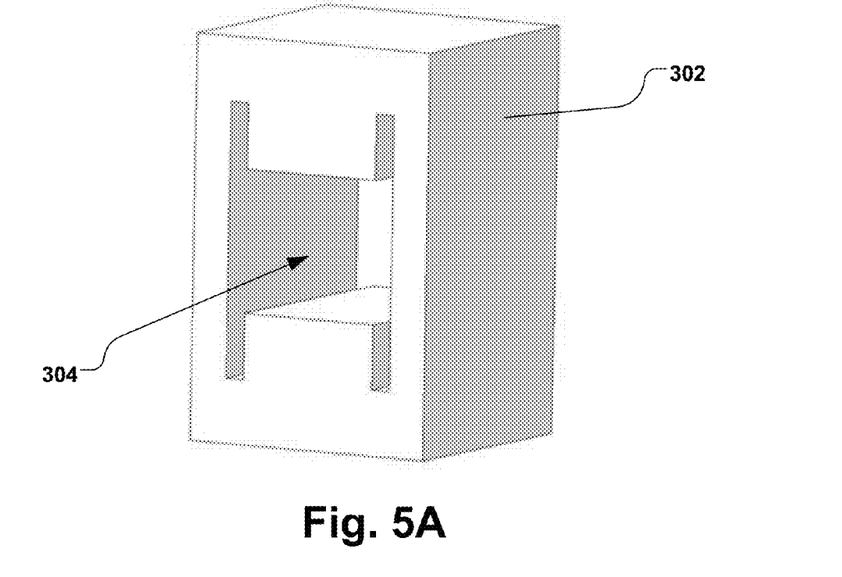
FIG. 5A is a perspective view of the yoke of the combined scanning and focusing magnet of FIG. 4 according to still another aspect of the disclosure.
Figure 5B:
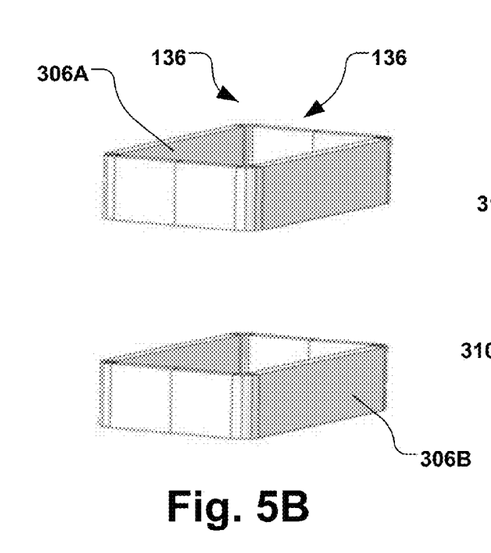
FIG. 5B is a perspective view of a dipole scanning coil of the combined scanning and focusing magnet of FIG. 4 according to yet another aspect of the disclosure.
Figure 5C:
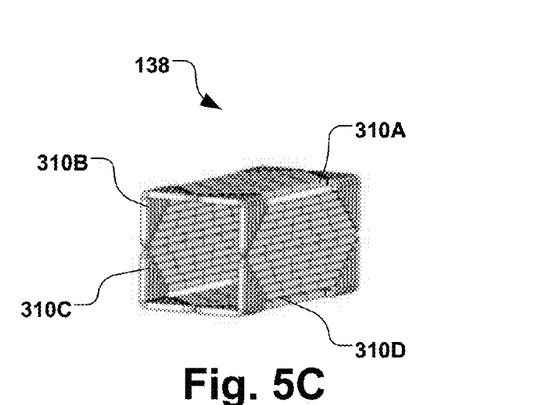
FIG. 5C is a perspective view of an exemplary Panofsky-type quadrupole focusing coil of the combined scanning and focusing magnet of FIG. 4 according to another aspect of the disclosure.

FIG. 4 illustrates another exemplary combined scanning and focusing magnet 300. The combined scanning and focusing magnet 300 of FIG. 4, for example, comprises a yoke 302 that generally defines a hole 304 configured to pass the ion beam 124 of FIG. 1 therethrough. The yoke 302 of FIG. 4, for example, is illustrated in FIG. 5A.

It should be noted that while specific numbers of scanner coils 206 focusing coils 210 are disclosed, the present disclosure contemplates any number of scanner coils and focusing coils, and such coils may be nested in various configurations and with any number respective coils, and all such variations are contemplated as falling within the scope of the present disclosure.

The combined scanning and focusing system 135 of FIG. 1 and the exemplary combined scanning and focusing magnets 200, 300 of FIGS. 2 and 4, for example, are thus advantageous over prior separate scanning and focusing systems, as the combined scanning and focusing magnet concept of the present disclosure provides an additional degree of controllability and focusing in a space otherwise occupied by only a scanning component. As such, a shorter overall beamline can be attained, due, at least in part, to the configuration of the combined scanning and focusing system 135.

In accordance with one exemplary aspect, to zero order, there will be no coupling between the dipole field of the scanner coils 136 of FIG. 1 and the multi-pole focusing coils 138 by virtue of the symmetry of the multi-pole coils. Such coupling, or mutual inductance, can be detrimental to the control of both magnets and can damage power supplies. In practice, however, there may be a relatively small degree of coupling due to imperfections in the windings and alignment of the coils 136, 138 and high-magnetic-permeability core or yoke 202, 302. Such small coupling, for example, can be reduced to a minimum by either active or passive filtering, wherein the input voltage at the power supplies 149, 150 (e.g., a multi-pole power supply) is within the supply specification, wherein a ripple in the current delivered to the multi-pole magnet is avoided.

In some instances, the use of filters can be problematic, especially if the scanner is driven over a large range of frequencies. In such instances, it may be desirable to reduce the mutual inductance to the maximum extent possible to avoid filtering altogether, or at least minimize the amount of filtering provided. One method of minimizing the coupling is to route the leads of the focusing coil 138 in such a way as to capture enough of the scanner magnet fringe field to cancel the mutual inductance. If this is not sufficient to reduce the coupled, however, then the focusing coils can have additional features, as described below.

One example for reducing such coupling includes one or more adjustable flux loop coils (not shown) in the multi-pole coil focusing 138 which does not contribute strongly to the desired fields, but generally cancels the mutual inductance. The flux loop coil(s) can be on the input, output, or both ends of the multi-pole focusing coil 138. The flux loop coil(s) can be located in the fringe field of the scanner dipole (e.g., shielded from the ion beam 124 by the scanner yoke), and thus perturbation to the ion beam may be minimized. The flux through such a loop or loops can be adjusted by changing the position of the coil, or by shielding the coil with an additional piece or pieces of steel, or by moving a yoke in and out of the coil. The number of turns in the flux loop coil, for example, is determined by the desired amount of flux to be cancelled. Such an adjustment may be made once, and then fixed, assuming the magnet is not disassembled or moved.

For example, leads of the focusing coil 138 are positioned to eliminate a mutual inductance between the focusing magnet and the scanning magnet. In one example, one or more auxiliary coils (not shown) are associated with the one or more focusing coils 138, wherein the one or more auxiliary coils are positioned in a fringe field region associated with the one or more scanner coils 136, whereby a mutual inductance between the one or more focusing coils and the one or more scanning coils is generally eliminated. In another example, an adjustable auxiliary yoke (not shown) has one or more auxiliary coils (not shown) wrapped around the auxiliary yoke, wherein the one or more auxiliary coils are positioned in the fringe field region associated with the one or more scanner coils 136, whereby a mutual inductance between the one or more focusing coils 138 and the one or more scanning coils is generally eliminated.

Figure 6:
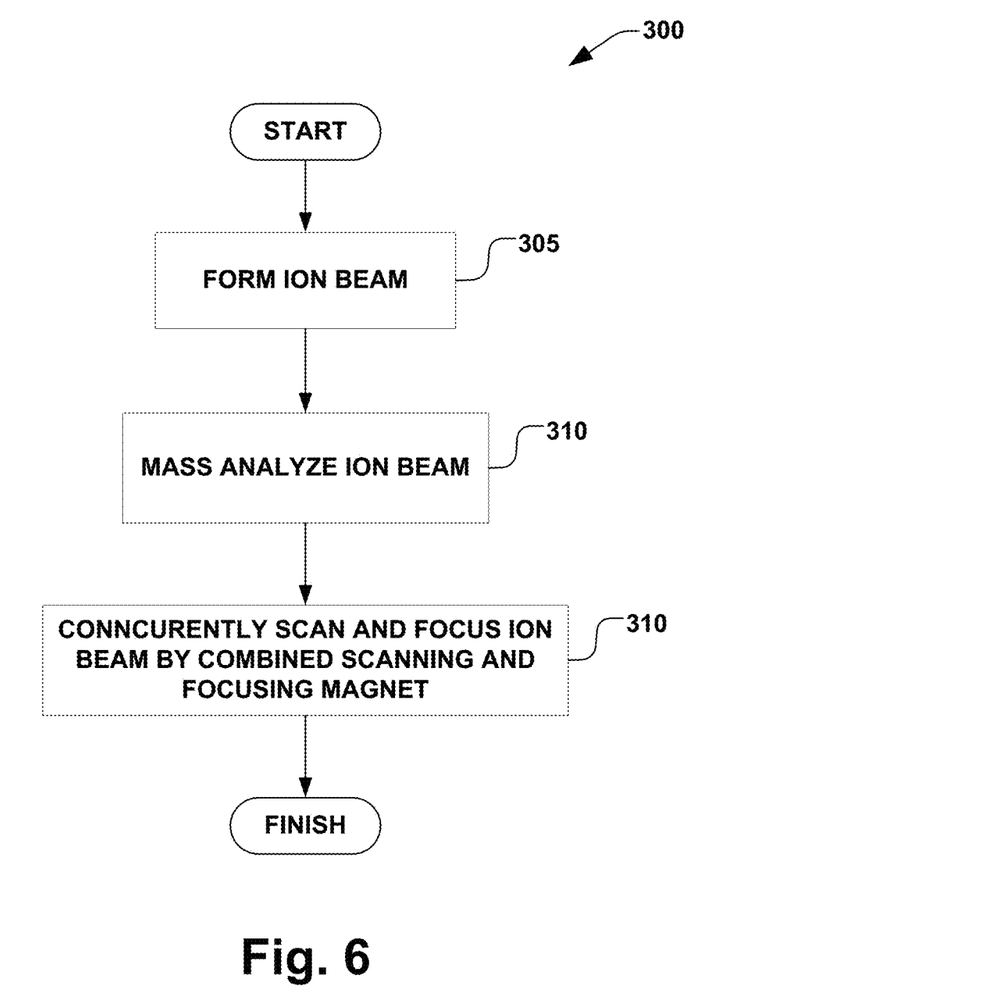
FIG. 6 illustrates an exemplary method for implanting ions into a workpiece in accordance with a further exemplary aspect of the present disclosure.

In accordance with another aspect of the present disclosure, FIG. 6 illustrates an exemplary method 500 for implanting ions into a workpiece. It should be noted that while exemplary methods are illustrated and described herein as a series of acts or events, it will be appreciated that the present disclosure is not limited by the illustrated ordering of such acts or events, as some steps may occur in different orders and/or concurrently with other steps apart from that shown and described herein, in accordance with the disclosure. In addition, not all illustrated steps may be required to implement a methodology in accordance with the present disclosure. Moreover, it will be appreciated that the methods may be implemented in association with the systems illustrated and described herein as well as in association with other systems not illustrated.

As illustrated in FIG. 6, the method 500 begins in act 502, whereby an ion beam is formed. The ion beam may be formed, for example, via the ion implantation system 100 of FIG. 1. In act 504, the ion beam is mass analyzed, and in act 506, the ion beam is concurrently scanned and focused via a combined scanning and focusing magnet, such as the combined scanning and focusing system 135 of FIG. 1. For example, concurrently scanning and focusing the ion beam may be performed utilizing one of the exemplary combined scanning and focusing magnets 200, 300 of FIGS. 2 and 4.

Although the disclosure has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the disclosure. In addition, while a particular feature of the disclosure may have been disclosed with respect to only one of several embodiments, such feature may be combined with one or more other features of the other embodiments as may be desired and advantageous for any given or particular application.

What is claimed is:

1. A combined scanning and focusing magnet, comprising:
   a yoke having a high magnetic permeability, the yoke defining a hole configured to pass an ion beam therethrough;
   one or more scanner coils operably coupled to the yoke and configured to generate a time-varying predominantly dipole magnetic field when electrically coupled to a power supply;
   one or more focusing coils operably coupled to the yoke and configured to generate a predominantly multipole magnetic field, wherein the predominantly multipole magnetic field is one of static or time-varying, wherein leads of the focusing magnet coil leads are positioned to eliminate a mutual inductance between the focusing magnet and the scanning magnet; and
   an adjustable auxiliary yoke, wherein one or more auxiliary coils are wrapped around the auxiliary yoke, wherein the one or more auxiliary coils are positioned in a fringe field region associated with the one or more scanner coils, whereby a mutual inductance between the one or more focusing coils and the one or more scanning coils is generally eliminated.

2. The combined scanning and focusing magnet of claim 1, wherein the yoke comprises a generally rectangular steel yoke.

3. The combined scanning and focusing magnet of claim 1, wherein the yoke comprises a plurality of laminated ferrous sheets.

4. The combined scanning and focusing magnet of claim 1, further comprising an alternating current power source, wherein the one or more scanner coils and one or more focusing coils are configured to receive power from the alternating current power source.

5. The combined scanning and focusing magnet of claim 1, further comprising a direct current power source, wherein the one or more scanner coils and one or more focusing coils are configured to receive power from the direct current power source.

6. The combined scanning and focusing magnet of claim 1, wherein the one or more focusing coils comprise Panofsky-type multipole coils.

7. The combined scanning and focusing magnet of claim 1, wherein the one or more focusing coils comprise one or more bedstead coils.

8. The combined scanning and focusing magnet of claim 1, wherein the one or more scanner coils comprise one or more bedstead coils.

9. An ion implantation system, comprising:
an ion source configured to generate an ion beam;
a mass resolving magnet configured to mass resolve the ion beam;
a mass resolving aperture positioned downstream of the mass resolving magnet, wherein the mass resolving aperture is configured to filter undesirable species from the ion beam, and wherein the ion beam generally diverges after passing through the mass resolving aperture; and
a combined scanning and focusing magnet positioned downstream of the mass resolving magnet, wherein a path of the ion beam is electromagnetically scanned, while concurrently focusing the ion beam, wherein the combined scanning and focusing magnet, comprises:
a yoke having a high magnetic permeability, the yoke defining a hole configured to pass an ion beam therethrough;
one or more scanner coils operably coupled to the yoke and configured to generate a time-varying predominantly dipole magnetic field when electrically coupled to a power supply;
one or more focusing coils operably coupled to the yoke and configured to generate a predominantly multipole magnetic field, wherein the predominantly multipole magnetic field is one of static or time-varying, wherein leads of the focusing magnet coil leads are positioned to eliminate a mutual inductance between the focusing magnet and the scanning magnet; and
an adjustable auxiliary yoke, wherein one or more auxiliary coils are wrapped around the auxiliary yoke, wherein the one or more auxiliary coils are positioned in a fringe field region associated with the one or more scanner coils, whereby a mutual inductance between the one or more focusing coils and the one or more scanning coils is generally eliminated.

10. The ion implantation system of claim 9, wherein the yoke comprises generally rectangular steel yoke.

11. The ion implantation system of claim 9, wherein the yoke comprises plurality of laminated ferrous sheets.

12. The ion implantation system of claim 9, wherein the one or more focusing coils comprise Panofsky-type multipole coils.

13. The ion implantation system of claim 9, wherein the one or more focusing coils comprise one or more bedstead coils.

14. The ion implantation system of claim 9, wherein the one or more scanner coils comprise one or more bedstead coils.

15. The ion implantation system of claim 9, further comprising a controller operably coupled to the ion source, mass resolving magnet, and combined scanning and focusing magnet, and configured to control the operation of at least one of the ion source, mass resolving magnet, and combined scanning and focusing magnet, at least in part, on a desired dosage and distribution of ions to be implanted into the workpiece.

16. The ion implantation system of claim 15, further comprising an alternating current power source, wherein the controller is configured to selectively provide alternating current to one or more of the scanner coil and one or more focusing coils.

17. The ion implantation system of claim 15, further comprising a direct current power source, wherein the controller is configured to selectively provide direct current to one or more of the scanner coil and one or more focusing coils.

18. The ion implantation system of claim 9, further comprising a measurement component configured to determine one or more characteristics of the ion beam, wherein the controller is further operably coupled to the measurement component and configured to further control the operation of at least one of the ion source, mass resolving magnet, and combined scanning and focusing magnet based, at least in part, on the determined one or more characteristics of the ion beam.

* * * * *